(12) United States Patent
Wang et al.

(10) Patent No.: US 12,013,261 B2
(45) Date of Patent: Jun. 18, 2024

(54) MAGNETIC SENSING FOR A GALVANOMETER SCANNER USING A HALL SENSOR FOR LIDAR SYSTEM

(71) Applicant: BEIJING VOYAGER TECHNOLOGY CO., LTD., Beijing (CN)

(72) Inventors: Youmin Wang, Berkeley, CA (US); Yufeng Wang, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 38 days.

(21) Appl. No.: 17/327,612

(22) Filed: May 21, 2021

(65) Prior Publication Data
US 2022/0381585 A1 Dec. 1, 2022

(51) Int. Cl.
*G01D 5/14* (2006.01)
*G01R 33/07* (2006.01)

(52) U.S. Cl.
CPC .......... *G01D 5/145* (2013.01); *G01R 33/072* (2013.01); *G01D 2205/40* (2021.05)

(58) Field of Classification Search
CPC ..................... G01D 5/145; G01D 2205/40
See application file for complete search history.

(56) References Cited

U.S. PATENT DOCUMENTS

| 2005/0007104 A1* | 1/2005 | Lequesne ............... G01D 5/145 |
| | | 324/207.25 |
| 2019/0049587 A1 | 2/2019 | Topliss et al. |
| 2019/0235229 A1* | 8/2019 | Ujiie ..................... G03B 21/28 |
| 2020/0011974 A1 | 1/2020 | Duan |
| 2020/0081103 A1 | 3/2020 | Petit |
| 2020/0182975 A1 | 6/2020 | Wang et al. |

(Continued)

FOREIGN PATENT DOCUMENTS

KR 20200122542 A 10/2020

OTHER PUBLICATIONS

International Search Report issued in corresponding International Application No. PCT/US2021/062265, dated Apr. 7, 2022, 4 pages.

(Continued)

*Primary Examiner* — Noam Reisner
(74) *Attorney, Agent, or Firm* — BAYES PLLC

(57) ABSTRACT

Embodiments of the disclosure provide magnetic sensing systems and methods for a galvanometer scanner configured to rotate within a predetermined angular range. An exemplary magnetic sensing system includes a disc permanent magnet configured to provide a magnetic field. The magnetic sensing system further includes a Hall sensor configured to generate a voltage proportional to the strength of the magnetic field as the Hall sensor and the disc permanent magnet move relatively to each other when the galvanometer scanner rotates. One of the disc permanent magnet and the Hall sensor locates on and rotates with the galvanometer scanner and the other locates off the galvanometer scanner. The magnetic sensing system also includes at least one controller configured to determine a rotation angle of the galvanometer scanner based on the generated voltage by the Hall Sensor.

20 Claims, 11 Drawing Sheets

(56) References Cited

U.S. PATENT DOCUMENTS

2020/0379109 A1* 12/2020 Duan .................... G01S 7/4817
2021/0396844 A1* 12/2021 Wang ..................... G01S 17/89

OTHER PUBLICATIONS

Written Opinion of the International Searching Authority issued in corresponding International Application No. PCT/US2021/062265, dated Apr. 7, 2022, 4 pages.

* cited by examiner

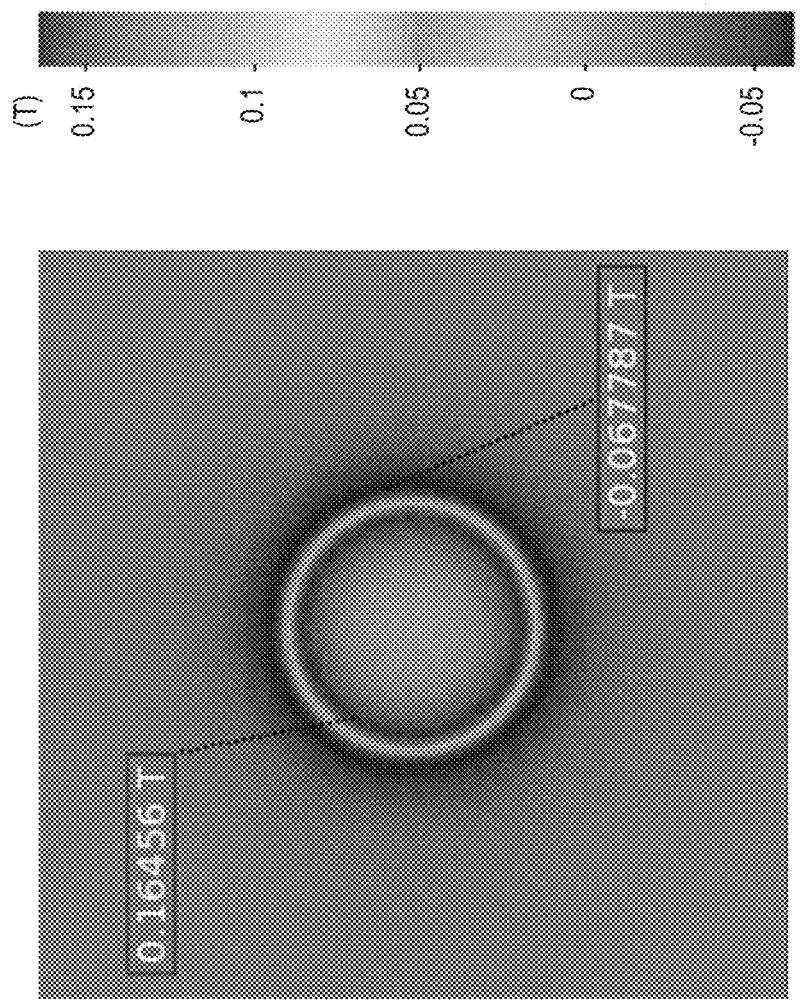
FIG. 4
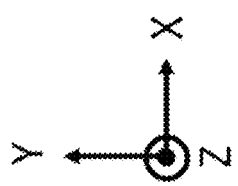

MAGNETIC SENSING FOR A GALVANOMETER SCANNER USING A HALL SENSOR FOR LIDAR SYSTEM

TECHNICAL FIELD

The present disclosure relates to systems and methods for magnetically sensing an angular position of a scanner in light detection and ranging (LiDAR) systems, and more particularly to, systems and methods for magnetically sensing an angular position of a galvanometer scanner using a Hall sensor in real-time during LiDAR scanning.

BACKGROUND

LiDAR systems have been widely used in advanced navigation technologies, such as to aid autonomous driving or to generate high-definition maps. For example, a typical LiDAR system measures the distance to a target by illuminating the target with pulsed laser light beams and measuring the reflected pulses with a sensor. Differences in laser light return times, wavelengths, and/or phases can then be used to construct digital three-dimensional (3D) representations of the target. Because using a narrow laser beam as the incident light can map physical features with very high resolution, a LiDAR system is particularly suitable for applications such as sensing in autonomous driving and high-definition map surveys.

Optical components used in LiDAR systems (hereafter also referred to as "LiDAR systems") may include a galvanometer scanner that can be rotated by an actuator to reflect (and steer) laser beams to an environment. For example, the galvanometer scanner may be used in a LiDAR transmitter to receive laser beams from a laser source and reflect the received laser beams towards a range of directions in order to scan a field of view (FOV). Because the LiDAR systems may desire a higher resolution around the center of each scan, the galvanometer scanner may be designed to scan at a slower speed (e.g., the galvanometer scanner rotates slower) in the middle of the scanning range. To achieve the desired scan resolution, it is beneficial to accurately sense the actual angular position (e.g., rotation angle, or also known as scanning angle) of the galvanometer scanner in real-time so that adaptive feedback control can be provided to adjust the scanning speed of the galvanometer scanner.

Embodiments of the disclosure address the above problems by providing magnetic sensing systems and methods for real-time sensing of the angular position of the galvanometer scanner used in LiDAR systems using a Hall sensor and a disc permanent magnet.

SUMMARY

Embodiments of the disclosure provide a magnetic sensing system for a galvanometer scanner configured to rotate within a predetermined angular range. An exemplary magnetic sensing system includes a disc permanent magnet configured to provide a magnetic field. The magnetic sensing system further includes a Hall sensor configured to generate a voltage proportional to the strength of the magnetic field as the Hall sensor and the disc permanent magnet move relatively to each other when the galvanometer scanner rotates. One of the disc permanent magnet and the Hall sensor locates on and rotates with the galvanometer scanner and the other locates off the galvanometer scanner. The magnetic sensing system also includes at least one controller configured to determine a rotation angle of the galvanometer scanner based on the generated voltage by the Hall Sensor.

Embodiments of the disclosure also provide a magnetic sensing method for a galvanometer scanner configured to rotate within a predetermined angular range. An exemplary magnetic sensing method includes moving a disc permanent magnet and a Hall sensor relative to each other as the galvanometer scanner rotates. One of the disc permanent magnet and the Hall sensor locates on and rotates with the galvanometer scanner and the other locates off the galvanometer scanner. The magnetic sensing method further includes measuring a voltage generated by the Hall sensor caused by the relative movement. The magnetic sensing method also includes determining, by at least one controller, a rotation angle of the galvanometer scanner based on the voltage generated by the Hall sensor.

Embodiments of the disclosure further provide a galvanometer scanner assembly. An exemplary galvanometer scanner assembly includes a galvanometer scanner configured to rotate around a rotation axis within a predetermined angular range. The galvanometer scanner assembly further includes a disc permanent magnet configured to provide a magnetic field. The galvanometer scanner assembly also includes a Hall sensor configured to generate a voltage proportional to the strength of the magnetic field as the Hall sensor and the disc permanent magnet move relatively to each other when the galvanometer mirror rotates. One of the disc permanent magnet and the Hall sensor locates on and rotates with the galvanometer scanner and the other locates off the galvanometer scanner.

It is to be understood that both the foregoing general description and the following detailed description are exemplary and explanatory only and are not restrictive of the invention, as claimed.

BRIEF DESCRIPTION OF THE DRAWINGS

FIG. 4 illustrates an exemplary distribution of magnetic flux density in a Z-axis direction near a disc permanent magnet, according to embodiments of the disclosure.

DETAILED DESCRIPTION

Figure 1:
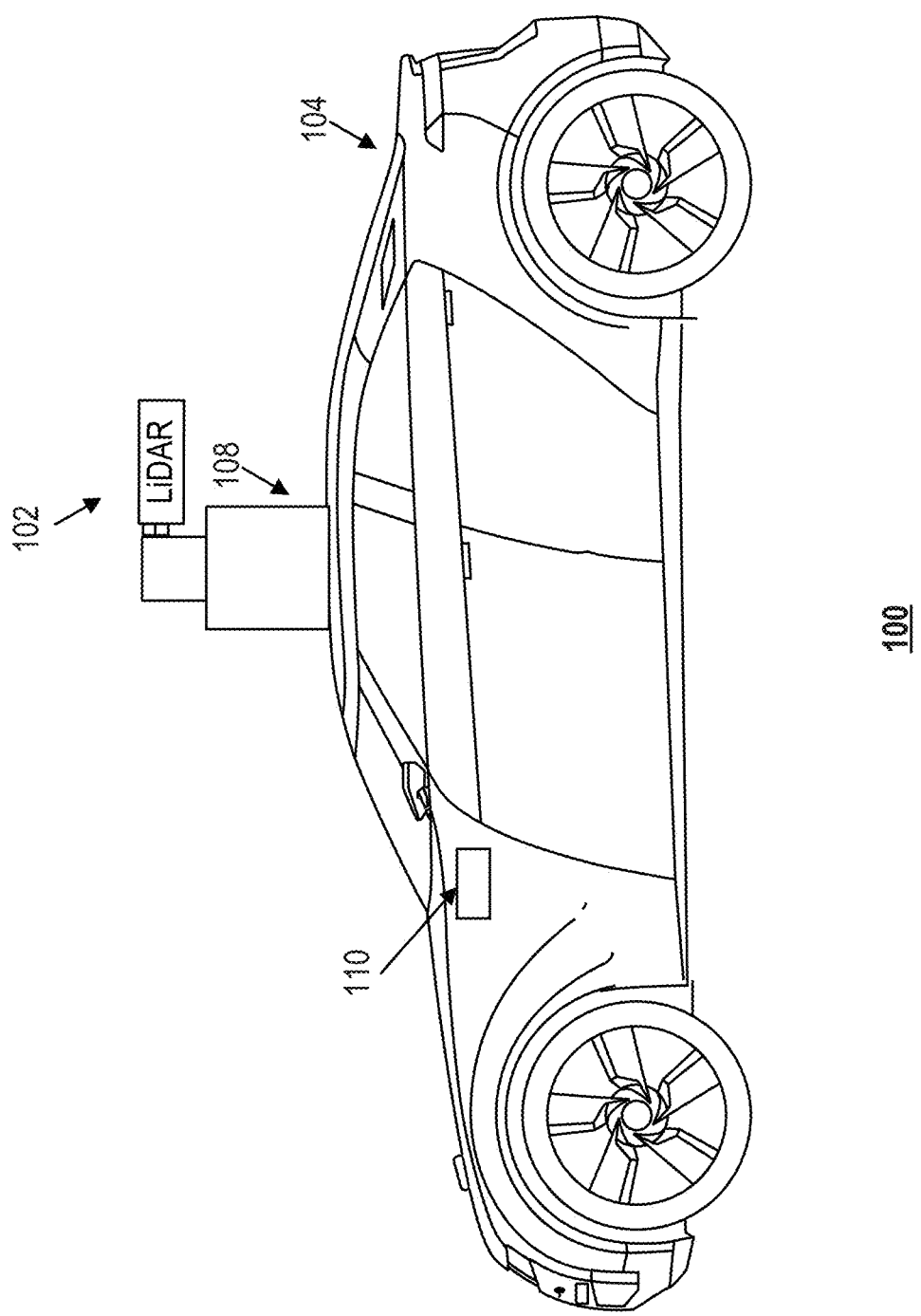
FIG. 1 illustrates a schematic diagram of an exemplary vehicle equipped with a LiDAR system, according to embodiments of the disclosure.

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide magnetic sensing systems and methods for sensing an angular position of a galvanometer scanner used in LiDAR systems. In some embodiments, the galvanometer scanner is configured to rotate around a rotation axis within a predetermined angular range. In some embodiments, the magnetic sensing system may include a disc permanent magnet, a Hall sensor, and at least one controller. The Hall sensor, also known as Hall-effect sensor, is a device to measure the strength of a magnetic field provided by the disc permanent magnet. An output voltage of the Hall sensor is directly proportional to the strength of the magnetic field through the Hall sensor. In some embodiments, the disc permanent magnet is mounted on the galvanometer scanner to move along with the galvanometer scanner when the galvanometer scanner rotates, and the Hall sensor locates off the galvanometer scanner. In some alternative embodiments, the Hall sensor is mounted on the galvanometer scanner and rotates with the galvanometer scanner while the disc permanent magnet locates off the galvanometer scanner. In both these embodiments, when the galvanometer scanner rotates, the Hall sensor moves relatively to the disc permanent magnet and generates a voltage that is proportional to the strength of the magnetic field through the Hall sensor.

To implement a closed-loop feedback control to control the movement of the galvanometer scanner, the rotation angle of the galvanometer scanner has to be accurately measured in real-time. In some embodiments, the controller may determine a real-time angular position (e.g., rotation angle) of the galvanometer scanner based on the voltage generated by the Hall sensor. For example, the controller may receive an electrical signal (e.g., a voltage) from the Hall sensor at a time point. A value of the strength of the magnetic field through the Hall sensor at the time point can be determined based on the received electrical signal. The controller may further determine a rotation angle of the galvanometer scanner based on the value of the strength of the magnetic field at the time point using a predetermined look-up table that maps the respective values of the strength of the magnetic field to rotation angles of the galvanometer scanner. In some embodiments, the controller may adaptively control one or more actuators to drive the galvanometer scanner to rotate based on this rotation angle sensed in real-time. For example, the controller may compare the determined angular position of the galvanometer scanner with a target rotation angle at the time point. The controller may further supply a control signal to the actuator(s) to speed up or slow down the rotation of the galvanometer scanner based on the comparison.

The features and advantages described herein are not all-inclusive and many additional features and advantages will be apparent to one of ordinary skill in the art in view of the figures and the following descriptions.

The LiDAR system containing the disclosed magnetic sensing systems and methods for the galvanometer scanner can be used in many applications. For example, the LiDAR system can be used in advanced navigation technologies, such as to aid autonomous driving or to generate high-definition maps, in which the LiDAR system can be equipped on a vehicle to capture data including the depth information of the surrounding objects (such as moving vehicles, buildings, road signs, pedestrians, and the like).

FIG. 1 illustrates a schematic diagram of an exemplary vehicle 100 equipped with an optical sensing system (e.g., a LiDAR system) 102 (hereinafter also referred to as LiDAR system 102), according to embodiments of the disclosure. Consistent with some embodiments, vehicle 100 may be a survey vehicle configured for acquiring data for constructing a high-definition map or 3-D buildings and city modeling. Vehicle 100 may also be an autonomous driving vehicle.

As illustrated in FIG. 1, vehicle 100 may be equipped with LiDAR system 102 mounted to a body 104 via a mounting structure 108. Mounting structure 108 may be an electro-mechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve desirable 3D sensing performance.

Consistent with some embodiments, LiDAR system 102 and sensor 110 may be configured to capture data as vehicle 100 moves along a trajectory. For example, a transmitter of LiDAR system 102 may be configured to scan the surrounding environment. LiDAR system 102 measures distance to a target by illuminating the target with a pulsed laser beam and measuring the reflected/scattered pulses with a receiver. The laser beams used for LiDAR system 102 may be ultraviolet, visible, or near infrared, and may be pulsed or continuous wave laser beams. In some embodiments of the present disclosure, LiDAR system 102 may capture point clouds including depth information of the objects in the surrounding environment, which may be used for constructing a high-definition map or 3-D buildings and city modeling. As vehicle 100 moves along the trajectory, LiDAR system 102 may continuously capture data including the depth information of the surrounding objects (such as moving vehicles, buildings, road signs, pedestrians, etc.) for map, building, or city modeling construction.

Figure 2:
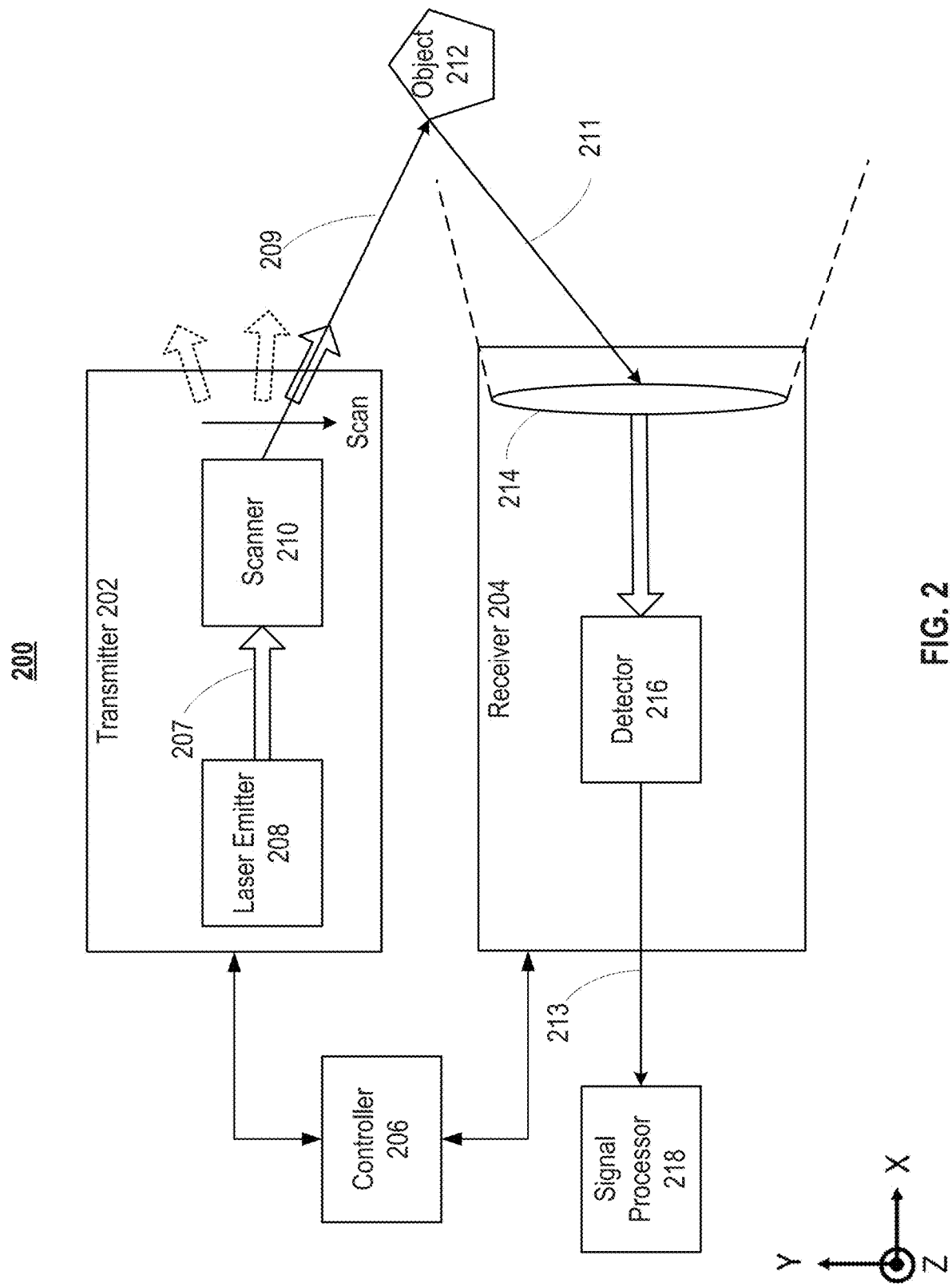
FIG. 2 illustrates a block diagram of an exemplary LiDAR system, according to embodiments of the disclosure.

FIG. 2 illustrates a block diagram of an exemplary LiDAR system 200, according to embodiments of the disclosure. LiDAR system 200 may include a transmitter 202, a receiver 204, a signal processor 218, and a controller 206 coupled to transmitter 202 and receiver 204. Transmitter 202 may further include a laser emitter 208 for emitting an optical signal and a scanner 210 for steering the received optical signal from laser emitter 208 to an environment. Receiver 204 may further include a condenser lens 214 and a detector 216.

Transmitter 202 may emit optical beams (e.g., pulsed laser beams, continuous wave (CW) beams, or frequency modulated continuous wave (FMCW) beams) along multiple directions. According to one example, transmitter 202 can sequentially emit a stream of pulsed laser beams in different directions within a scan range (e.g., a range in angular degrees), as illustrated in FIG. 2. Laser emitter 208 may be configured to provide laser beams 207 (also referred to as "native laser beam") to scanner 210. In some embodiments of the present disclosure, laser emitter 208 may generate a pulsed laser beam in the ultraviolet, visible, or near infrared wavelength range.

In some embodiments of the present disclosure, laser emitter 208 may include a pulsed laser diode (PLD), a CW laser diode, a vertical-cavity surface-emitting laser (VCSEL), a fiber laser, etc. For example, a PLD or a CW laser diode may be a semiconductor device similar to a light-emitting diode (LED) in which the laser beam is created at the diode's junction. Depending on the semiconductor materials of diodes in laser emitter 208, the wavelength of laser beams 207 provided by a PLD may be larger than 700 nm, such as 760 nm, 785 nm, 808 nm, 848 nm, 905 nm, 940 nm, 980 nm, 1064 nm, 1083 nm, 1310 nm, 1480 nm, 1512 nm, 1550 nm, 1625 nm, 1654 nm, 1877 nm, 1940 nm, 2000 nm, etc. It is understood that any suitable laser emitter may be used as laser emitter 208 for emitting laser beams 207 at a proper wavelength.

Figure 3:
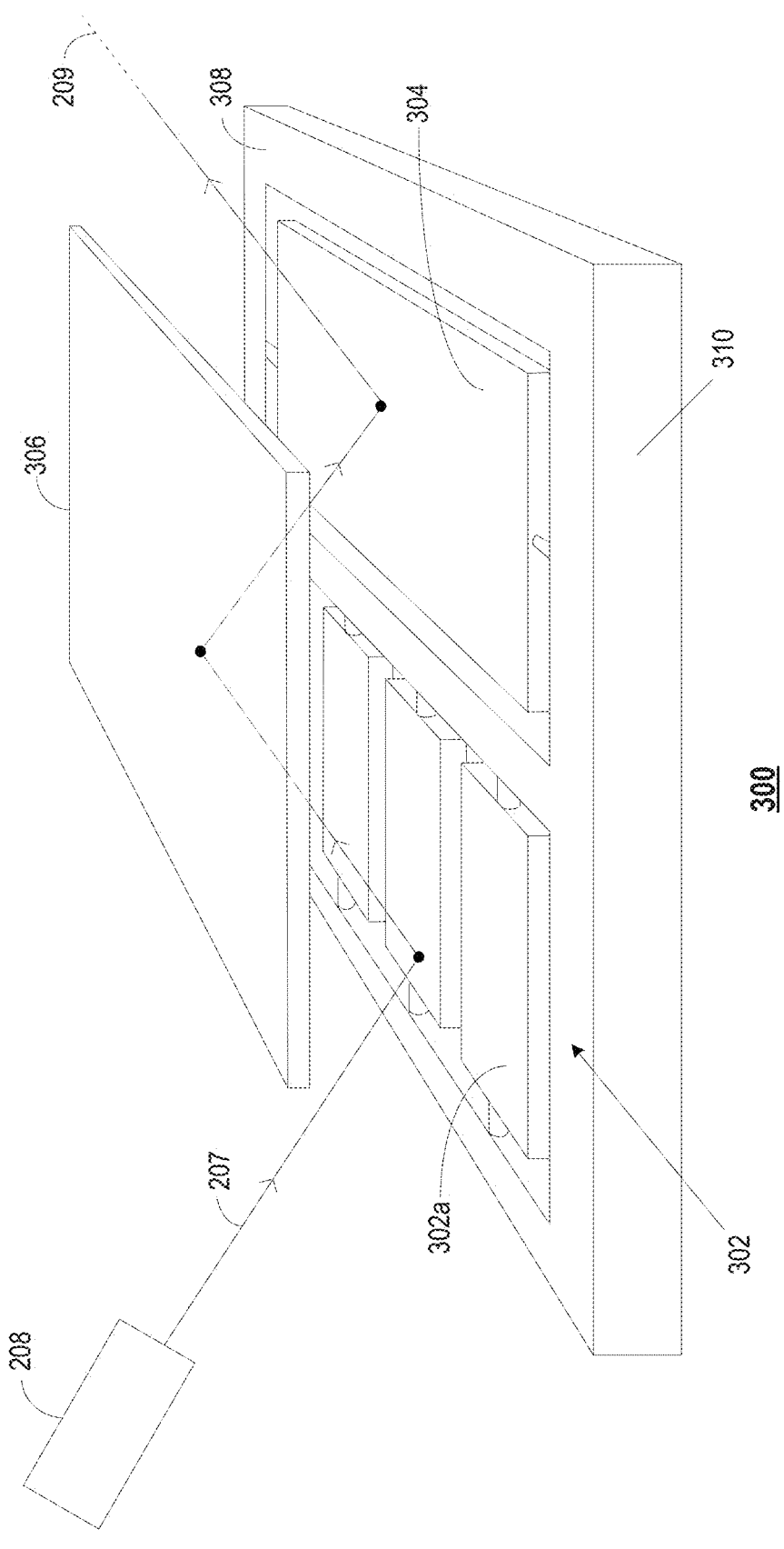
FIG. 3 illustrates a schematic diagram of an exemplary mirror assembly in a scanner and its operations, according to embodiments of the disclosure.

Scanner 210 may be configured to emit laser beams 209 to an object 212 in a direction within a range of scanning angles. Consistent with the present disclosure, scanner 210 may include a galvanometer scanner. In some embodiments, scanner 210 may include a mirror assembly (not shown) to receive laser beams 207 and steer them to the environment by forming laser beams 209. For example, FIG. 3 illustrates a schematic diagram of an exemplary mirror assembly 300 in scanner 210 and its operations, according to embodiments of the disclosure. In some embodiments, as shown in FIG. 3, mirror assembly 300 may include an array of first rotatable mirrors 302 including a first rotatable mirror 302a, with each rotatable mirror of the array rotatable around a fast axis (e.g., the Y-axis), a single second rotatable mirror 304 rotatable around a slow axis (e.g., the Z-axis), and a stationary mirror 306. In some embodiments, the array of first rotatable mirrors 302 can be microelectromechanical systems (MEMS) devices implemented on a surface 308 of a semiconductor substrate 310. The MEMS mirrors may be driven by MEMS actuators to rotate. The array of MEMS mirrors along with the actuators collectively form a MEMS scanner. Second rotatable mirror 304 can be a non-MEMS mirror implemented on surface 308 of semiconductor substrate 310. Second rotatable mirror 304 may be driven by an actuator to rotate within a limited angular range, such as 30-40 degrees. For example, the actuator may include a mirror galvanometer and second rotatable mirror 304 may be attached to the galvanometer's shaft. The actuator may further include separate drive electronics such as servo amplifiers, servo driver, or scanner amplifier. Second rotatable mirror 304 along with its actuator collectively form a mechanical scanner, e.g., a galvanometer scanner. Stationary mirror 306 can be positioned above semiconductor substrate 310.

As shown in FIG. 3, the array of first rotatable mirrors 302 may receive laser beam 207 from laser emitter 208 and reflect laser beam 207 towards stationary mirror 306, which can reflect laser beam 207 towards second rotatable mirror 304. Second rotatable mirror 304 can reflect laser beam 207 received from stationary mirror 306 to form laser beam 209 and emit it to the environment. In some embodiments, first rotatable mirrors 302 and second rotatable mirror 304 may cooperatively rotate to steer laser beam 209 at different angles with respect to, respectively, a first dimension and a second dimension orthogonal to the first dimension, to form a two-dimensional FOV. For example, first rotatable mirrors 302 may be driven by the actuators to scan the first dimension and second rotatable mirror 304 may be driven by the mirror galvanometer to scan the second dimension.

Returning to FIG. 2, scanner 210 may further include a magnetic sensing system (not shown) to sensing a real-time angular position of a galvanometer scanner (e.g., second rotatable mirror 304 in mirror assembly 300 along with its mirror galvanometer). As will be described below in greater detail, the magnetic sensing system may be configured to determine an actual angular position of the galvanometer scanner at any given time point, which can be used to provide feedback control to the scanning process. In some embodiments of the present disclosure, scanner 210 may also include other optical components (e.g., lenses, mirrors) that can focus pulsed laser light into a narrow laser beam to increase the scan resolution and the range to scan object 212.

Object 212 may be made of a wide range of materials including, for example, non-metallic objects, rocks, rain, chemical compounds, aerosols, clouds and even single molecules. The wavelength of laser beams 209 may vary based on the composition of object 212. In some embodiments, at each time point during the scan, scanner 210 may emit laser beams 209 to object 212 in a direction within a range of scanning angles. Upon contact, laser beams 209 may be reflected by object 212 via backscattering, such as Raman scattering, and fluorescence to form laser beams 211.

In some embodiments, receiver 204 may be configured to detect laser beams 211 returned from object 212. The returned laser beams 211 may be in a different direction from laser beams 209. Receiver 204 can collect laser beams returned from object 212 and output electrical signals reflecting the intensity of the returned laser beams. As illustrated in FIG. 2, receiver 204 may include lens 214 and detector 216. At each time point during the scan, lens 214 may be configured to collect light from a respective direction in its FOV and converge the laser beams to focus before it is received on detector 216.

Detector 216 may be configured to detect laser beams passing through lens 214 and convert the detected laser beams into the output electrical signals. In some embodiments, detector 216 may convert the laser beams (e.g., returned laser beams 211) collected by lens 214 into electrical signals 213 (e.g., current or voltage signals). Electrical signals 213 may be generated when photons are absorbed in a photodiode included in detector 216. In some embodiments of the present disclosure, detector 216 may include a PIN detector, a PIN detector array, an avalanche photodiode (APD) detector, a APD detector array, a single photon avalanche diode (SPAD) detector, a SPAD detector array, a silicon photo multiplier (SiPM/MPCC) detector, a SiP/MPCC detector array, or the like.

LiDAR system 200 may also include one or more signal processor 218. Signal processor 218 may receive electrical signals 213 generated by detector 216. Signal processor 218 may process electrical signals 213 to determine, for example, distance information carried by electrical signals 213. Signal processor 218 may construct a point cloud based on the processed information. Signal processor 218 may include a microprocessor, a microcontroller, a central processing unit (CPU), a graphical processing unit (GPU), a digital signal processor (DSP), or other suitable data processing devices. In some embodiments, signal processor 218 may be part of controller 206.

LiDAR system 200 may further include one or more controllers, such as a controller 206. Controller 206 may control the operation of transmitter 202 and/or receiver 204 to perform detection/sensing operations. Controller 206 may include components (not shown) such as a communication interface, a processor, a memory, and a storage for performing various control functions. In some embodiments, controller 206 may have different modules in a single device, such as an integrated circuit (IC) chip (implemented as, for example, an application-specific integrated circuit (ASIC) or a field-programmable gate array (FPGA)), or separate devices with dedicated functions. In some embodiments, the processor may include any appropriate type of general-purpose or special-purpose microprocessor, digital signal processor, or microcontroller. The memory or storage may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. For example, the memory and/or the storage may be configured to store program(s) that may be executed by the processor to control the operation of scanner 210.

In some embodiments, controller 206 may control a magnetic sensing system to sense a voltage caused by relative movement of a Hall sensor and a permanent magnet and determine an actual rotation angle of the galvanometer scanner (e.g., the scanner using second rotatable mirror 304) in scanner 210 in real-time based on the voltage generated by the Hall sensor. In some embodiments, controller 206 may send control signals to scanner 210 to control the rotation of the galvanometer scanner based on the sensed rotation angle. For example, controller 206 may implement a feedback control loop to control the galvanometer scanner based on the real-time sensing.

FIG. 4 illustrates an exemplary distribution of magnetic flux density in the Z-axis direction near a disc permanent magnet, according to embodiments of the disclosure. The surface of the disc permanent magnet (not shown) is parallel to XY-plane. The strength of the magnetic field shown in FIG. 4 is measured at a distance of 1 mm above the surface of the disc permanent magnet. A radius of the exemplary disc permanent magnet is 1.5 mm. A highest magnetic flux density in the Z-axis direction shown in FIG. 4 is 0.16456 tesla (T), and a lowest magnetic flux density in the Z-axis direction is −0.067787 T (a minus sign means a negative Z-axis direction). As shown in FIG. 4, the magnetic field is centrosymmetrically distributed and the strength of magnetic field is a function of a distance to the center of the disc permanent magnet.

Figure 5:
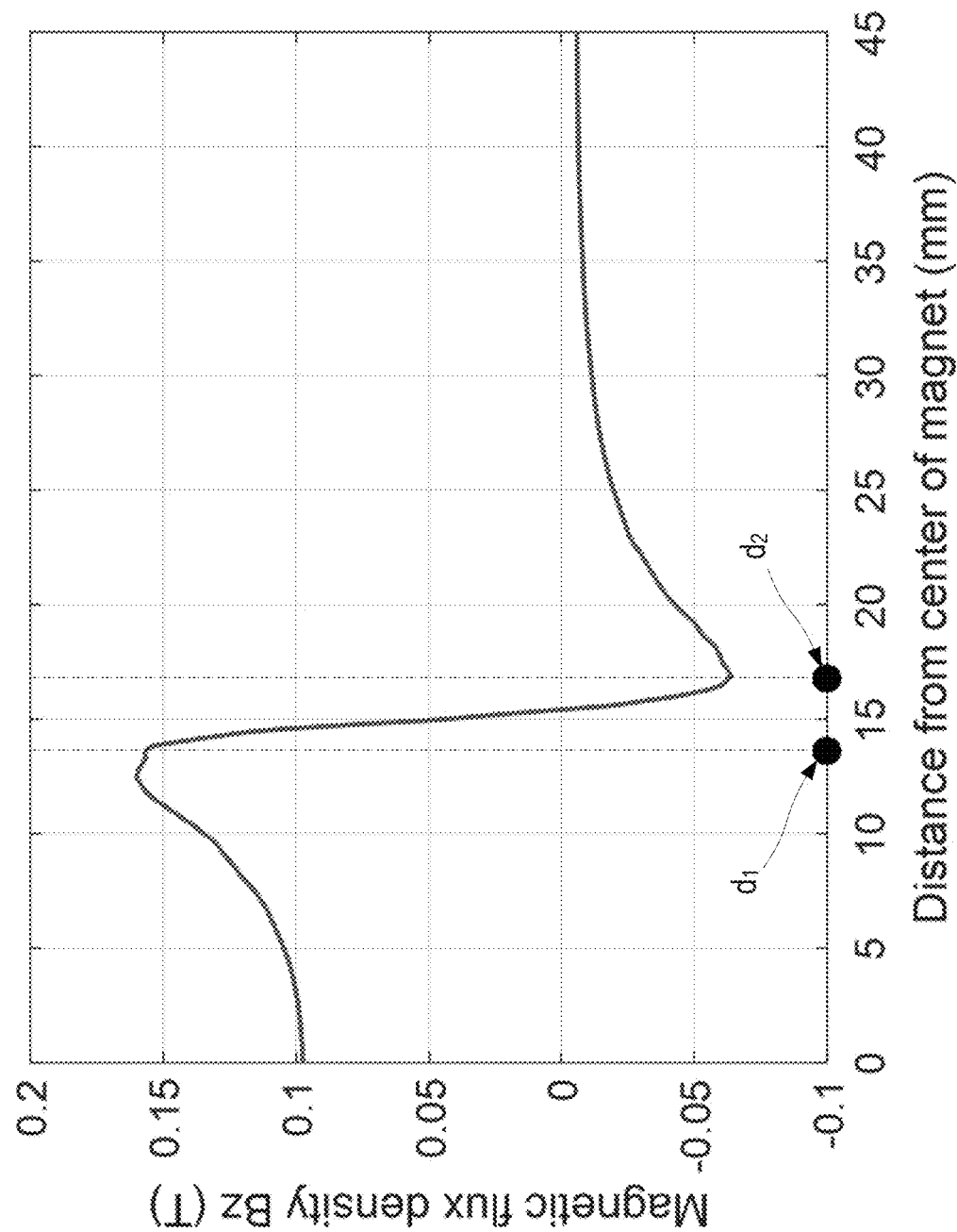
FIG. 5 illustrates a line diagram of an exemplary relationship between a distance to the center of the disc permanent magnet and the magnetic flux density in a Z-axis direction of FIG. 4, according to embodiments of the disclosure.

For example, FIG. 5 illustrates a line diagram of an exemplary relationship between a distance to the center of the disc permanent magnet and the magnetic flux density in the Z-axis direction (Bz) of FIG. 4, according to embodiments of the disclosure. As shown in FIG. 5, the magnetic flux density Bz (T) is a function of the distance to the center of the disc permanent magnet and Bz monotonically decreases when the distance to the center of the disc permanent magnet increases from $d_1$ to $d_2$. In some embodiments, the magnetic flux density Bz can be measured using a Hall sensor in the disclosed magnetic sensing systems. The Hall sensor may generate a voltage proportional to the strength of the magnetic field (e.g., the magnetic flux density Bz). For example, when the distance from the Hall sensor to the center of the disc permanent magnet increases from $d_1$ to $d_2$, the voltage generated by the Hall sensor monotonically decreases.

Figure 6:
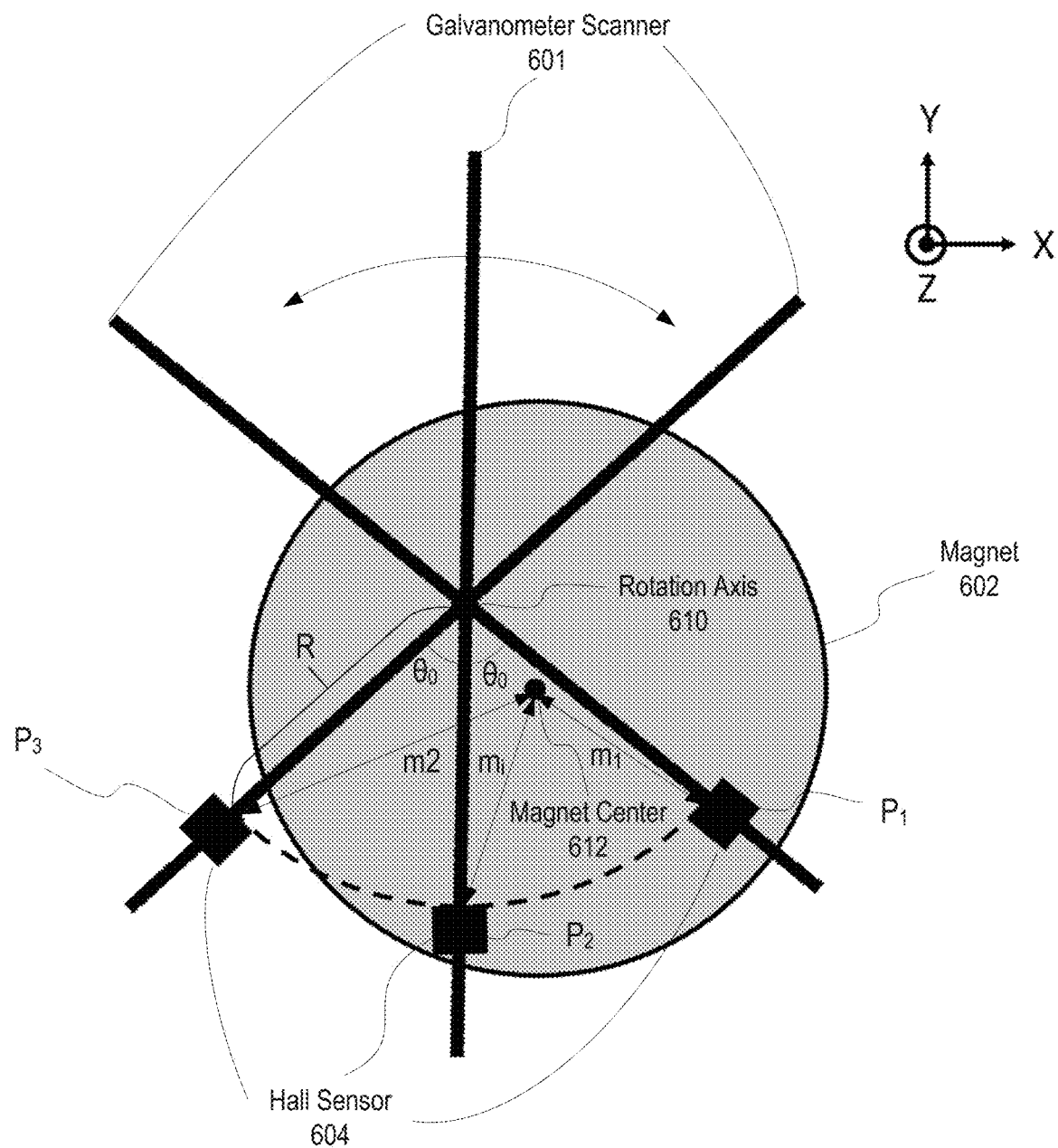
FIG. 6 illustrates a schematic diagram of an exemplary magnetic sensing system with a Hall sensor rotating along with a galvanometer scanner and a fixed disc permanent magnet, according to some embodiments of the disclosure.

In some embodiments, the disc permanent magnet in the disclosed magnetic sensing system may be fixed on a substrate and the Hall sensor may be mounted on the galvanometer scanner. For example, FIG. 6 illustrates a schematic diagram of an exemplary magnetic sensing system 600 with a Hall sensor 604 rotating along with a galvanometer scanner 601 and a fixed disc permanent magnet 602, according to some embodiments of the disclosure. When the disc permanent magnet (e.g., disc permanent magnet 602) is fixed on the substrate and does not rotate with the galvanometer scanner, the disclosed magnetic sensing system may be able to include a disc permanent magnet with a larger size to provide a stronger magnetic field. The stronger magnetic field may improve the signal-to-noise ratio in an output signal from the Hall sensor.

As shown in FIG. 6, magnetic sensing system 600 may include a disc permanent magnet 602 (hereafter also referred to as "magnet 602") and Hall sensor 604. Magnet 602 (illustrated as a grey circle) is fixed on the substrate (not shown). Magnet center 612 is the center of magnet 602. Hall sensor 604 is mounted on galvanometer scanner 601 which rotates around a rotation axis 610 (e.g., the Z-axis) within a predetermined angular range (e.g., between $-\theta_0$ degrees and $+\theta_0$ degrees, a minus sign means a negative X-axis direction). In some embodiments, galvanometer scanner 601 may symmetrically oscillate in a swing mode around its non-tile position. $\theta_0$ is a maximum rotation angle for galvanometer scanner 601 from a non-tile position to a farthest position. Galvanometer scanners typically have limited rotation range. For example, a value of $\theta_0$ may be equal to 10 degrees, 15 degrees, 20 degrees, 25 degrees, 30 degrees, etc. In some embodiments, Hall sensor 604 is placed parallel to the surface of magnet 602 to measure the strength of the magnet field passing through it. For example, the orientation of Hall sensor 504 is parallel to the XY-plane and perpendicular to rotation axis 610 in order to detect the strength of the magnet field in the Z-axis direction through Hall sensor 604 (e.g., magnetic flux density Bz).

As shown in FIG. 6, an arcuated trajectory of Hall sensor 604 is illustrated in a dashed arc. In some embodiments, when Hall sensor 604 rotates to a position $P_1$ (e.g., a position nearest to magnet center 612 on the arcuated trajectory), the strength of the magnet field through Hall sensor 604 (e.g., magnetic flux density Bz) reaches a highest value comparing to those strengths at other positions on the arcuated trajectory. At position $P_1$, the rotation angle of galvanometer scanner 601 also reaches the upper limit of the rotation range (e.g., $\theta_0$ degrees). $m_1$ is a distance from Hall sensor 604 at position $P_1$ to magnet center 612, where $m_1 >= d_1$ in FIG. 5. When Hall sensor 604 rotates to a position $P_3$ (e.g., a position farthest to magnet center 612 on the arcuated trajectory), the strength of the magnet field through Hall sensor 604 (e.g., magnetic flux density Bz) reaches a lowest value comparing to those strengths at other positions on the arcuated trajectory. At position $P_3$, the rotation angle of galvanometer scanner 601 also reaches the lower limit of the rotation range (e.g., $-\theta_0$ degrees). $m_2$ is a distance from Hall sensor 604 at position $P_3$ to magnet center 612, where $m_2 <= d_2$ in FIG. 5. When Hall sensor 604 rotates to a position other than positions $P_1$ and $P_3$ (e.g., position $P_2$) on the arcuated trajectory, a distance $m_i$ from Hall sensor 604 at position $P_2$ to magnet center 612 may be longer than $m_1$ but shorter than $m_2$ (i.e., $m_1 < m_t < m_2$). As shown in FIG. 6, when Hall sensor 604 rotates to position $P_2$, galvanometer scanner 601 is in a non-tile status (e.g., galvanometer scanner 601 is parallel to the YZ-plane), and the rotation angle of galvanometer scanner 601 is 0.

In some embodiments, the center of the disc permanent magnet (e.g., magnet center 612) is not on the rotation axis (e.g., rotation axis 610) of the galvanometer mirror (e.g., galvanometer scanner 601). For example, if coordinates of rotation axis 610 in the XY-plane are (0,0), coordinates of Hall sensor 604 at position $P_1$ are $(x_1, y_1)$ that can be determined according to equations (1):

$$\begin{cases} x_1 = R \cdot \sin\theta_0 \\ y_1 = -R \cdot \cos\theta_0 \end{cases} \quad (1)$$

where $\theta_0$ is a maximum rotation angle for galvanometer scanner 601 (e.g., from position $P_2$ to position $P_1$), and R is a radius of the arcuated trajectory of Hall sensor 604, which equals a distance between Hall sensor 604 and rotation axis 610. Similarly, coordinates of Hall sensor 604 at position $P_3$ are $(x_2, y_2)$ that can be determined according to equations (2):

$$\begin{cases} x_2 = -R \cdot \sin\theta_0 \\ y_2 = -R \cdot \cos\theta_0 \end{cases} \quad (2)$$

Coordinates of magnet center 612 in the XY-plane are $(x_0, y_0)$ that can be determined according to equations (3):

$$\begin{cases} x_0 = \dfrac{m_2^2 - m_1^2}{4R \cdot \sin\theta_0} \\ y_0 = -R \cdot \cos\theta_0 + \sqrt{R^2 \cdot \cos^2\theta_0 - R^2 + \dfrac{m_2^2 + m_1^2}{2} - \dfrac{(m_2^2 - m_1^2)^2}{16R^2 \cdot \sin^2\theta_0}} \end{cases} \quad (3)$$

A distance $d_t$ between magnet center 612 and Hall sensor 604 at a time point t can be determined according to equation (4):

$$d_t = \sqrt{(R \cdot \sin\theta_t - x_0)^2 + (-R \cdot \cos\theta_t - y_0)^2} \quad (4)$$

where $\theta_t$ is a rotation angle of galvanometer scanner 601 at time point t, and $-\theta_0 \leq \theta_t \leq \theta_0$.

In some embodiments, the radius of the arcuated trajectory of Hall sensor 604 is selected to ensure the distance between Hall sensor 604 and magnet center 612 changes monotonically as galvanometer scanner 601 rotates within the predetermined angular range (e.g., from $-\theta_0$ degrees to $+\theta_0$ degrees or from $+\theta_0$ degrees to $-\theta_0$ degrees). For example, when Hall sensor 604 rotates from position $P_3$ to position $P_1$ (e.g., the rotation angle of the galvanometer scanner increases unidirectionally from $-\theta_0$ degrees to $+\theta_0$ degrees), the distance from Hall sensor 604 to magnet center 612 decreases monotonically from $m_2$ to $m_1$ and the strength of the magnet field through Hall sensor 604 (e.g., magnetic flux density Bz) increases monotonically. When Hall sensor 604 rotates from position $P_1$ to position $P_3$ (e.g., the rotation angle of the galvanometer scanner decreases unidirectionally from $+\theta_0$ degrees to $-\theta_0$ degrees), the distance from Hall sensor 604 to magnet center 612 increases monotonically from $m_1$ to $m_2$ and the strength of the magnet field through Hall sensor 604 (e.g., magnetic flux density Bz) decreases monotonically. The monotonical relationship between the angular position of Hall sensor 604 and the distance from Hall sensor 604 to magnet center 612 and the monotonical relationship between this distance and the strength of the magnet field detected by Hall sensor 604 create a mapping between the angular position of Hall sensor 604 and the detected magnetic flux density at that scanning angle. Accordingly, an angular position of Hall sensor 604 (e.g., the rotation angle of galvanometer scanner 601) at any given time point can be determined based on the detected magnetic flux density by Hall sensor 604 at that time point.

Figure 7:
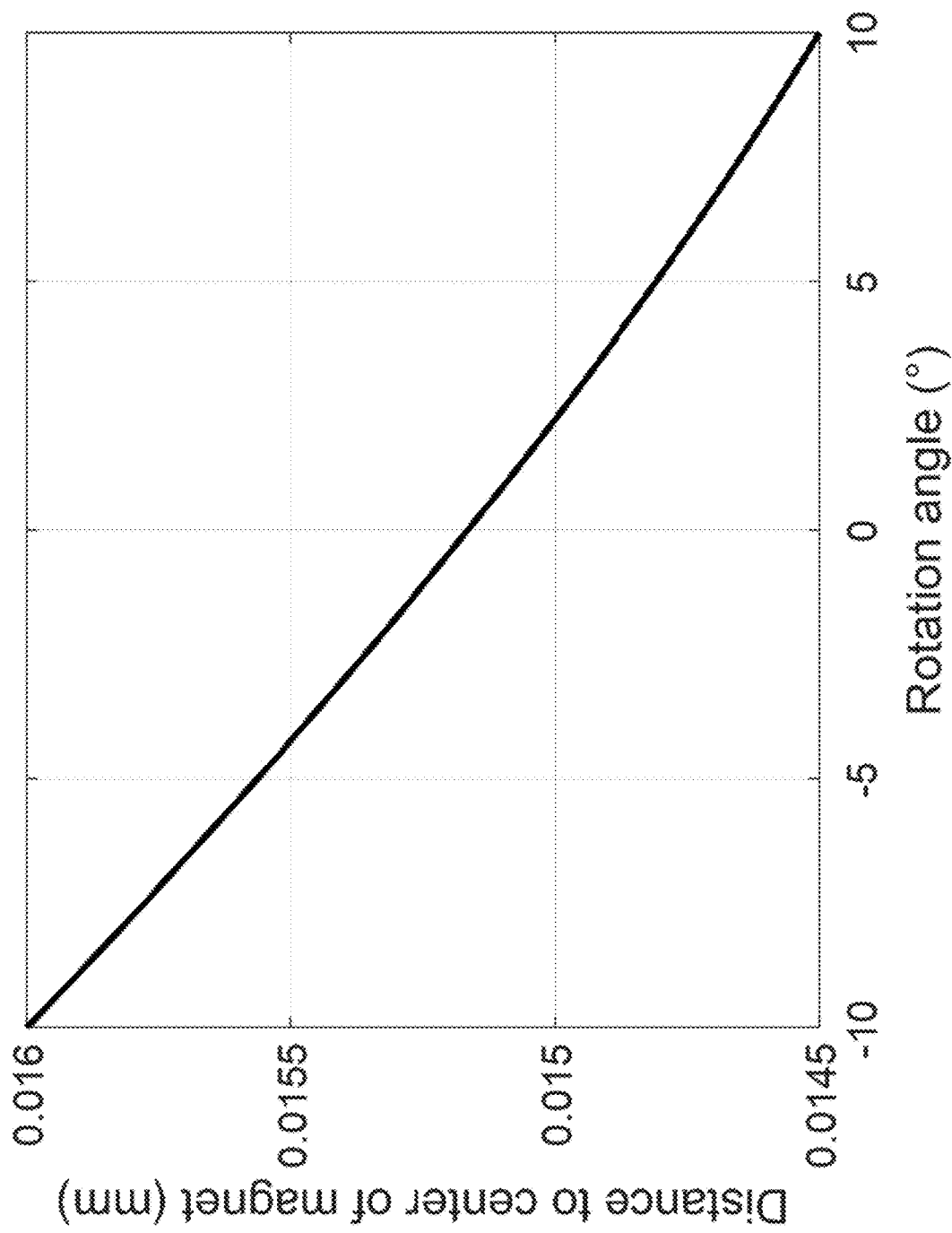
FIG. 7 illustrates a line diagram of an exemplary relationship between a distance to the center of a disc permanent magnet and a rotation angle of a galvanometer scanner, according to embodiments of the disclosure.

FIG. 7 illustrates a line diagram of an exemplary relationship between a distance to the center of a disc permanent magnet and a rotation angle of a galvanometer scanner, according to embodiments of the disclosure. As shown in FIG. 7, the distance to the center of the disc permanent magnet from the Hall sensor monotonically decreases as the rotation angle of the galvanometer scanner increases from −10 degrees to +10 degrees. The rotation angle of the galvanometer scanner at a time point thereby can be determined based on the distance between the center of a disc permanent magnet and the Hall sensor at the time point.

Figure 8:
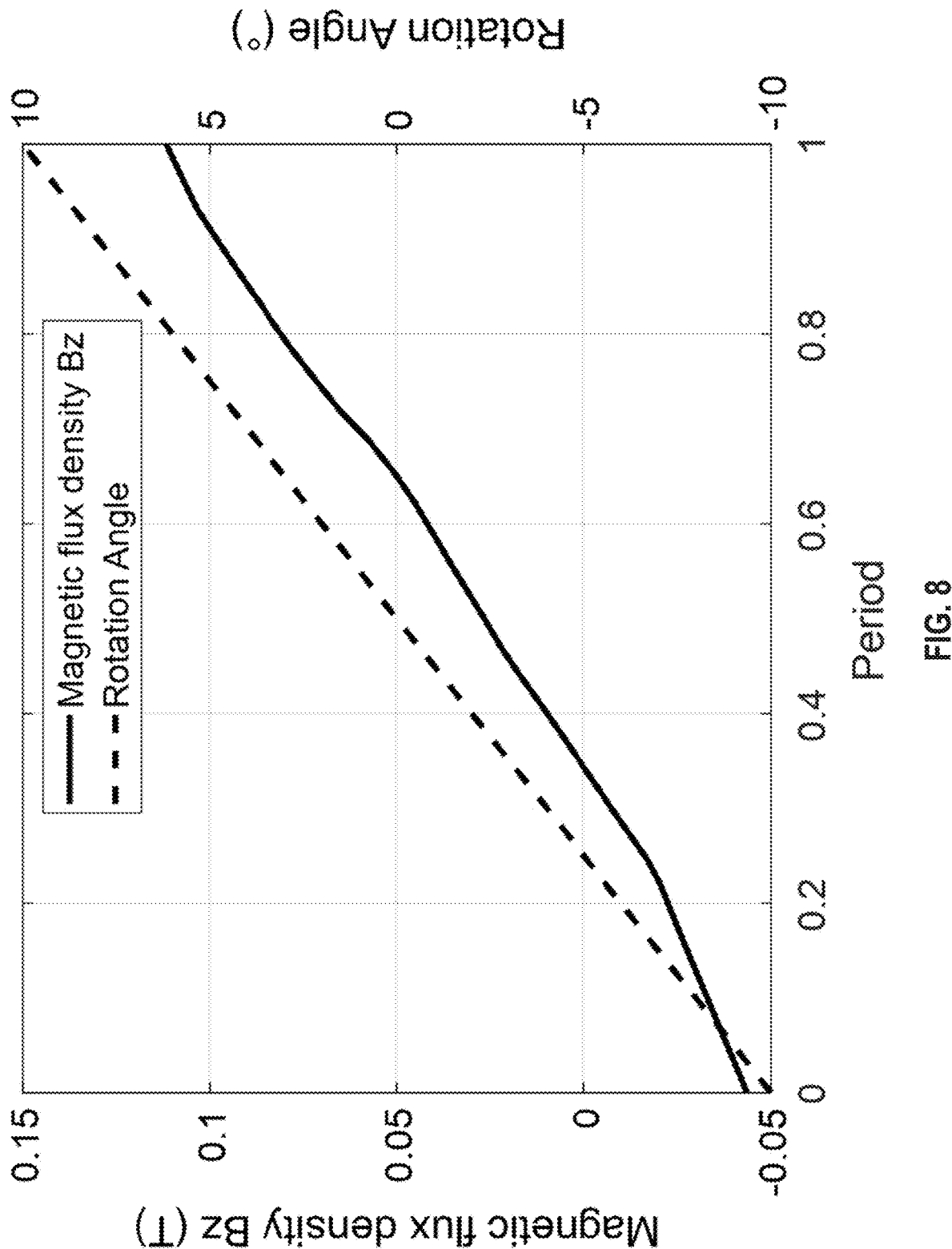
FIG. 8 illustrates a line diagram of an exemplary relationship between a magnetic flux density in a Z-axis direction and a rotation angle of a galvanometer scanner in a rotation period of the galvanometer scanner, according to embodiments of the disclosure.

FIG. 8 illustrates a line diagram of an exemplary relationship between a magnetic flux density in a Z-axis direction and a rotation angle of a galvanometer scanner in a rotation period of the galvanometer scanner, according to embodiments of the disclosure. In some embodiments, FIG. 8 may be generated based on the relationships illustrated in FIG. 5 and FIG. 7. As shown in FIG. 8, the magnetic flux density Bz monotonically increases in the entire rotation period as the rotation angle of the galvanometer scanner increases from −10 degrees to 10 degrees. The rotation angle of the galvanometer scanner at a given time point (e.g., expressed as a percentage of the rotation period) thereby can be determined based on a value of magnetic flux density Bz at the given time point according to the relationship illustrated in FIG. 8.

Figure 9:
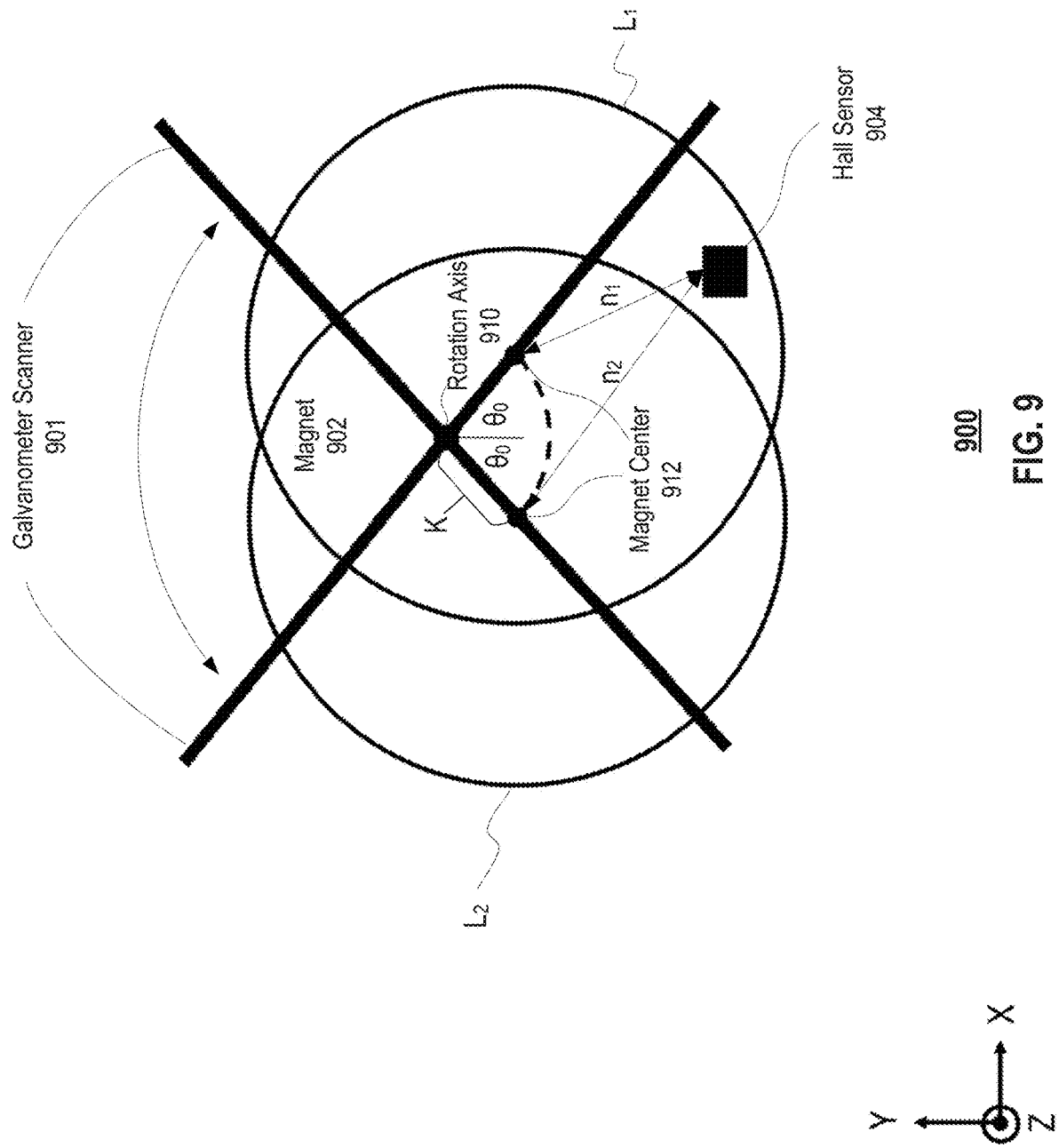
FIG. 9 illustrates a schematic diagram of another exemplary magnetic sensing system having a disc permanent magnet rotating along with a galvanometer scanner and a fixed Hall sensor, according to some embodiments of the disclosure.

In some alternative embodiments, the Hall sensor in the disclosed magnetic sensing system may be fixed on the substrate and the disc permanent magnet may be mounted on the galvanometer scanner. For example, FIG. 9 illustrates a schematic diagram of another exemplary magnetic sensing system 900 having a disc permanent magnet rotating along with a galvanometer scanner and a fixed Hall sensor, according to some embodiments of the disclosure. Because the Hall sensor may require a power supply to generate electrical signals, fixing the Hall sensor on the substrate may simplify a circuit design for the disclosed magnetic sensing system.

As shown in FIG. 9, a disc permanent magnet 902 (illustrated in a solid-line circle) is mounted on a galvanometer scanner 901 that rotates around a rotation axis 910 in a swing mode within a predetermined angular range (e.g., between $-\theta_0$ degrees and $+\theta_0$ degrees, a minus sign means a negative X-axis direction). Consistent with some embodiments, galvanometer scanner 901 may symmetrically oscillate in the swing mode around its non-tile position (where the degree rotation angle is 0 degree). $\theta_0$ is a maximum rotation angle for galvanometer scanner 901 from the non-tile position to a farthest position. For example, a value of $\theta_0$ may be equal to 10 degrees. Disc permanent magnet 902 (hereafter also referred to as "magnet 902") rotates along with galvanometer scanner 901 around rotation axis 910. Magnet center 912 is the center of magnet 902. Magnet 902 is placed on galvanometer scanner 901 such that it does not locate on rotation axis 910. As a result, magnet center 912 moves around rotation axis 910 along an arcuated trajectory (illustrated in a dashed arc in FIG. 9) as galvanometer scanner 901 rotates. Hall sensor 904 is mounted on the substrate (not shown). In some embodiments, magnet 902 moves in a plane that is perpendicular to rotation axis 910. For example, as shown in FIG. 9, rotation axis 910 is parallel to the Z-axis and magnet 902 rotates in a plane that is parallel to the XY-plane. Consistent with some embodiments, the Hall sensor is placed parallel to the surface of the disc permanent magnet to measure the strength of the magnet field through it. For example, the orientation of Hall sensor 904 is parallel to XY-plane and perpendicular to rotation axis 910 in order to detect the strength of the magnet field passing through Hall sensor 904 (e.g., magnetic flux density Bz).

In some embodiments, when magnet 902 rotates to a position $L_1$ (e.g., the rotation angle of galvanometer scanner 901 reaches $+\theta_0$ degrees), a distance from Hall sensor 904 to magnet center 912 may equal $n_1$, where $n_1 >= d_1$ in FIG. 5 and $n_1$ is a shortest distance between Hall sensor 904 and magnet center 912 in a rotation period of the galvanometer mirror. At position $L_1$, the strength of the magnet field through Hall sensor 904 (e.g., magnetic flux density Bz) reaches a highest value comparing to those strengths at other positions on the arcuated trajectory of magnet center 912. As shown in FIG. 9, when magnet 902 rotates to a position $L_2$ (e.g., the rotation angle of galvanometer mirror 901 equals $-\theta_0$ degrees), the distance from Hall sensor 904 to magnet center 912 may equal $n_2$, where $n_2 <= d_2$ in FIG. 5 and $n_2$ is a longest distance between Hall sensor 904 and magnet center 912 in the rotation period of the galvanometer scanner. At position $L_2$, the strength of the magnet field through Hall sensor 904 (e.g., magnetic flux density Bz) reaches a lowest value comparing to those strengths at other positions on the arcuated trajectory of magnet center 912.

In some embodiments, if coordinates of rotation axis 910 on XY-plane are (0,0), coordinates of magnet center 912 at position $L_1$ are $(x_1', y_1')$ that can be determined according to equations (5):

$$\begin{cases} x_1' = K \cdot \sin\theta_0 \\ y_1' = -K \cdot \cos\theta_0 \end{cases} \quad (5)$$

where $\theta_0$ is a maximum rotation angle for galvanometer scanner 901 (e.g., from the non-tile position to position $L_1$), and K is a radius of the arcuated trajectory of magnet center 912, which equals a distance between magnet center 912 and rotation axis 910. In some embodiments, K is smaller than a radius of magnet 902. Coordinates of magnet center 912 at position $L_2$ are $(x_2', y_2')$ that can be determined according to equations (6):

$$\begin{cases} x_2' = -K \cdot \sin\theta_0 \\ y_2' = -K \cdot \cos\theta_0 \end{cases} \quad (6)$$

Coordinates of Hall sensor 904 in the XY-plane are $(x_0', y_0')$ that can be determined according to equations (7):

$$\begin{cases} x_0' = \dfrac{n_2^2 - n_1^2}{4R \cdot \sin\theta_0} \\ y_0' = -K \cdot \cos\theta_0 + \sqrt{K^2 \cdot \cos^2\theta_0 - K^2 + \dfrac{n_2^2 + n_1^2}{2} - \dfrac{(n_2^2 - n_1^2)^2}{16K^2 \cdot \sin^2\theta_0}} \end{cases} \quad (7)$$

A distance $d_s$ between magnet center 912 and Hall sensor 904 at a time point s can be determined according to equation (8):

$$d_s = \sqrt{(K \cdot \sin\theta_s - x_0')^2 + (-K \cdot \cos\theta_s - y_0')^2} \quad (8)$$

where $\theta_s$ is a rotation angle of galvanometer scanner 901 at time points, and $-\theta_0 \le \theta_s \le \theta_0$.

In some embodiments, the radius of the arcuated trajectory of Hall sensor 904 is selected to ensure the distance between Hall sensor 904 and magnet center 912 changes monotonically as galvanometer scanner 901 rotates within the predetermined angular range (e.g., from $-\theta_0$ degrees to $+\theta_0$ degrees or from $+\theta_0$ degrees to $-\theta_0$ degrees). For example, when magnet 902 rotates from position $L_2$ to position $L_1$ (e.g., the rotation angle of the galvanometer scanner increases unidirectionally from $-\theta_0$ degrees to $+\theta_0$ degrees), the distance from Hall sensor 904 to magnet center 912 decreases monotonically from $n_2$ to $n_1$ and the strength of the magnet field through Hall sensor 904 (e.g., magnetic flux density Bz) increases monotonically. When magnet 902 rotates from position $L_1$ to position $L_2$ (e.g., the rotation angle of the galvanometer scanner decreases unidirectionally from $+\theta_0$ degrees to $-\theta_0$ degrees), the distance from Hall sensor 904 to magnet center 912 increases monotonically from $n_1$ to $n_2$ and the strength of the magnet field through Hall sensor 904 (e.g., magnetic flux density Bz) decreases monotonically. The monotonical relationship between the angular position of Hall sensor 904 and the distance from Hall sensor 904 to magnet center 912 and the monotonical relationship between this distance and the strength of the magnet field detected by Hall sensor 904 create a mapping between the angular position of Hall sensor 904 and the detected magnetic flux density at that scanning angle. Accordingly, an angular position of magnet 902 (e.g., the rotation angle of galvanometer scanner 901) at any given time point can be determined based on the detected magnetic flux density by Hall sensor 904 (e.g., magnetic flux density Bz) at that time point. In some embodiments, the rotation angle of the galvanometer scanner and the magnetic flux density Bz may have a similar relationship as the one shown in FIG. 8.

In some embodiments, the mapping between rotation angles and values of the strength of the magnetic field (e.g., magnetic flux density Bz) may be calculated offline and recorded in a look-up table. In some embodiments, the look-up table may be preprogramed in controller 206. Consistent with some embodiments, controller 206 may further provide a closed-loop feedback control to the galvanometer scanner based on the determined rotation angle of the galvanometer scanner using the look-up table.

Figure 10:
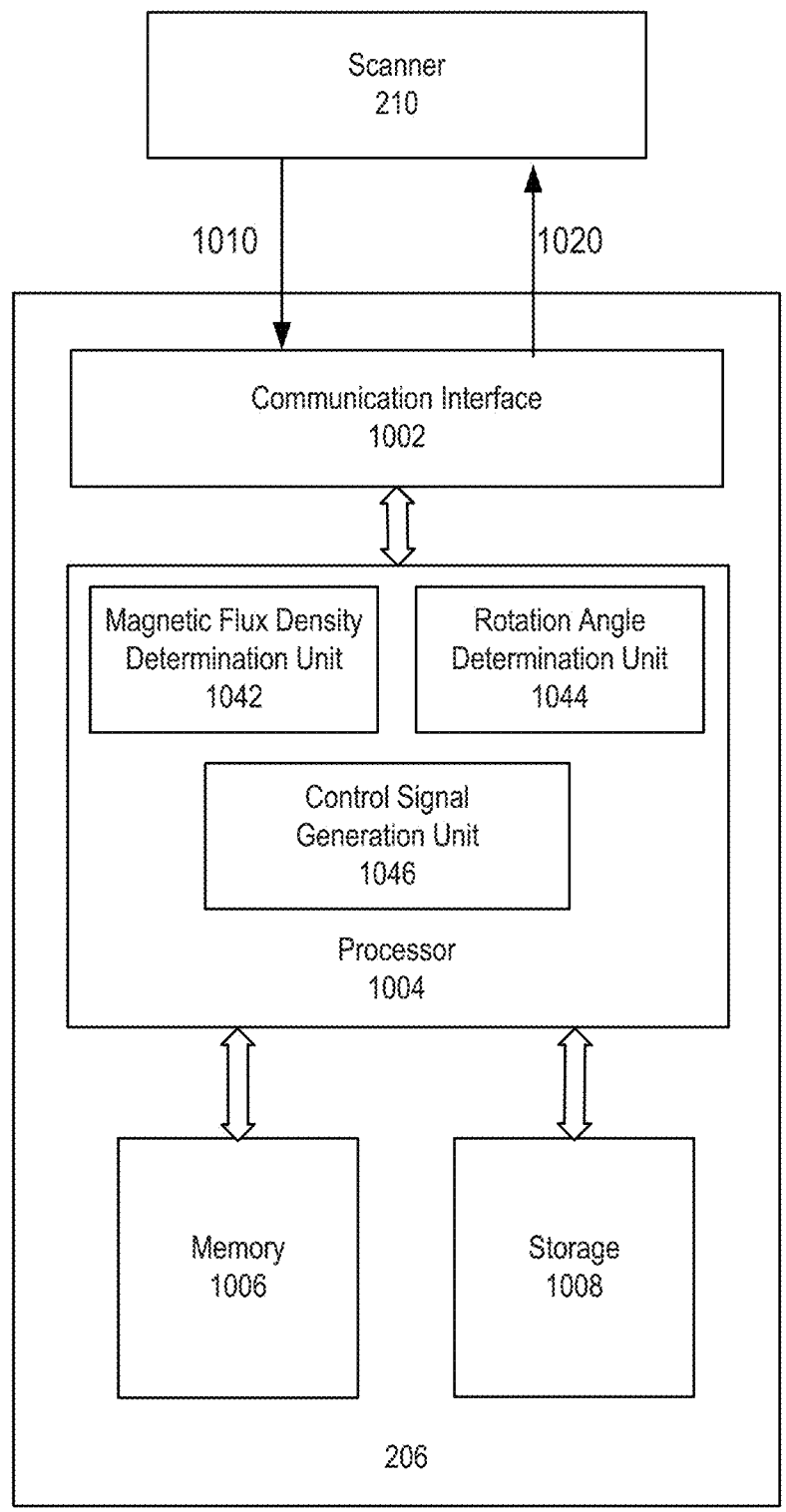
FIG. 10 illustrates a schematic diagram of an exemplary controller for determining a rotation angle of a galvanometer scanner, according to embodiments of the disclosure.

For example, FIG. 10 illustrates a block diagram of an exemplary controller 206 for determining a rotation angle of a galvanometer scanner, according to embodiments of the disclosure. Consistent with the present disclosure, controller 206 may be configured to receive and process the voltage signal from the Hall sensor in the magnetic sensing system. Controller 206 may further be configured to determine an angular position (e.g., rotation angle) of the galvanometer scanner based on the processed voltage at a given time point. Controller 206 may also be configured to generate a control signal based on the determined rotation angle for feedback control of the galvanometer scanner via the actuator(s).

In some embodiments, as shown in FIG. 10, controller 206 may include a communication interface 1002, a processor 1004, a memory 1006, and a storage 1008. In some embodiments, controller 206 may have different modules in a single device, such as an integrated circuit (IC) chip implemented as an application-specific integrated circuit (ASIC) or a field-programmable gate array (FPGA), or separate devices with dedicated functions. Components of controller 206 may be in an integrated device, or distributed at different locations but communicate with each other through a network (not shown). For example, processor 1004 may be a processor on-board LiDAR system 200, a processor inside a standalone computing, or a cloud processor, or any combinations thereof.

Communication interface 1002 may send data to and receive data from components such as transmitter 202/receiver 204 via communication cables, a Wireless Local Area Network (WLAN), a Wide Area Network (WAN), wireless networks such as radio waves, a nationwide cellular network, and/or a local wireless network (e.g., Bluetooth™ or WiFi), or other communication methods. In some embodiments, communication interface 1002 can be an integrated services digital network (ISDN) card, cable modem, satellite modem, or a modem to provide a data communication connection. As another example, communication interface 1002 can be a local area network (LAN) card to provide a data communication connection to a compatible LAN. Wireless links can also be implemented by communication interface 1002. In such an implementation, communication interface 1002 can send and receive electrical, electromagnetic or optical signals that carry digital data streams representing various types of information via a network.

Processor 1004 may include any appropriate type of general-purpose or special-purpose microprocessor, digital signal processor, or microcontroller. Processor 1004 may be configured as a separate processor module dedicated to detecting a rotation angle of the galvanometer scanner at any given time point and adaptively controlling the rotation of the galvanometer scanner based on the detected rotation angle. Alternatively, processor 1004 may be configured as a shared processor module for performing other functions such as controlling transmitter 202/receiver 204.

As shown in FIG. 10, processor 1004 may include multiple modules, such as a magnetic flux density determination unit 1042, a rotation angle determination unit 1044, a control signal generation unit 1046, and the like. These modules (and any corresponding sub-modules or sub-units) can be hardware units (e.g., portions of an integrated circuit) of processor 1004 designed for use with other components or to execute a part of a program. The program may be stored on a computer-readable medium, and when executed by processor 1004, it may perform one or more functions. Although FIG. 10 shows units 1042-1046 all within one processor 1004, it is contemplated that these units may be distributed among multiple processors located near or remotely with each other.

In some embodiments, magnetic flux density determination unit 1042 may be configured to receive an electrical signal 1010 (e.g., a voltage signal) from scanner 210 (e.g., from the Hall sensor of the magnetic sensing system). Consistent with some embodiments, because electrical signal 1010 generated by the Hall sensor (e.g., Hall sensor 604 or 904) is proportional to the strength of the magnetic field (e.g., magnetic flux density Bz) through the Hall sensor, the magnetic flux density through the Hall sensor at any given time point can be uniquely determined based on the received electrical signal from scanner 210 using a one-to-one mapping. It is contemplated that magnetic flux density determination unit 1042 of controller 206 may use any suitable approaches to determine the magnetic flux density based on electrical signal 1010 at any given time point. For example, a look-up table can be pre-computed to map the electrical signals to the magnetic flux densities.

In some embodiments, rotation angle determination unit 1044 may be configured to determine the rotation angle of the galvanometer scanner based on the magnetic flux density (e.g., magnetic flux density Bz) determined by magnetic flux density determination unit 1042. In some embodiments, a look-up table may be used to map each value of the magnetic flux density Bz to one of rotation angles of the galvanometer scanner. In one example, the look-up table may be pre-computed and stored in memory 1006/storage 1008 of controller 206 and retrieved by rotation angle determination unit 1044. In another example, the look-up table may be stored and updated in a remote location and retrieved by controller 206 via communication interface 1002 as needed. In yet another example, the rotation angle may be computed on-the-fly according to mathematical relationships described above. It is contemplated that rotation angle determination unit 1044 of controller 206 may use any other suitable approach to determine the rotation angle based on electrical signal 1010 at any given time point.

In some embodiments, control signal generation unit 1046 may be configured to generate control signals in order to provide a closed-loop feedback control to the galvanometer scanner, e.g., by sending the control signals (e.g., a control signal 1020) to the actuator(s) of the galvanometer scanner. For example, controller 206 may compare the sensed rotation angle with a target rotation angle of the galvanometer scanner at a corresponding time point. Consistent with some embodiments, the actual rotation angle is determined by rotation angle determination unit 1044 based on the magnetic flux density Bz through the Hall sensor at the sensing time point. The target rotation angle is an intended rotation angle of the galvanometer scanner at the same time point. If the determined rotation angle is smaller than the intended angle, controller 206 may send a control signal to the actuator(s) of the galvanometer scanner to increase the speed of the galvanometer scanner. Otherwise, if the determined rotation angle is larger than the intended angle at the sensing time point, controller 206 may send a control signal to the actuator(s) to slow down the galvanometer scanner. Using the closed-loop control based on a real-time sensing of the rotation angle, the galvanometer scanner may be adjusted to a target angle that is intended.

Memory 1006 and storage 1008 may include any appropriate type of mass storage provided to store any type of information that processor 1004 may need to operate. Memory 1006 and storage 1008 may be a volatile or non-volatile, magnetic, semiconductor, tape, optical, removable, non-removable, or other type of storage device or tangible (i.e., non-transitory) computer-readable medium including, but not limited to, a ROM, a flash memory, a dynamic RAM, and a static RAM. Memory 1006 and/or storage 1008 may be configured to store one or more computer programs that may be executed by processor 1004 to perform functions disclosed herein. For example, memory 1006 and/or storage 1008 may be configured to store program(s) that may be executed by processor 1004 for adaptive control of the rotation of the galvanometer scanner in real-time.

Memory 1006 and/or storage 1008 may be further configured to store information and data used by processor 1004. For instance, memory 1006 and/or storage 1008 may be configured to store the look-up table that maps the values of the magnetic flux density Bz to the rotation angles of the galvanometer scanner. In some embodiments, memory 1006 and/or storage 1008 may also store intermediate data such as determined magnetic flux densities, determined rotation angles, comparison results of each pair of the determined rotation angle and the target rotation angle, etc. The various types of data may be stored permanently, removed periodically, or disregarded immediately after each scan.

Figure 11:
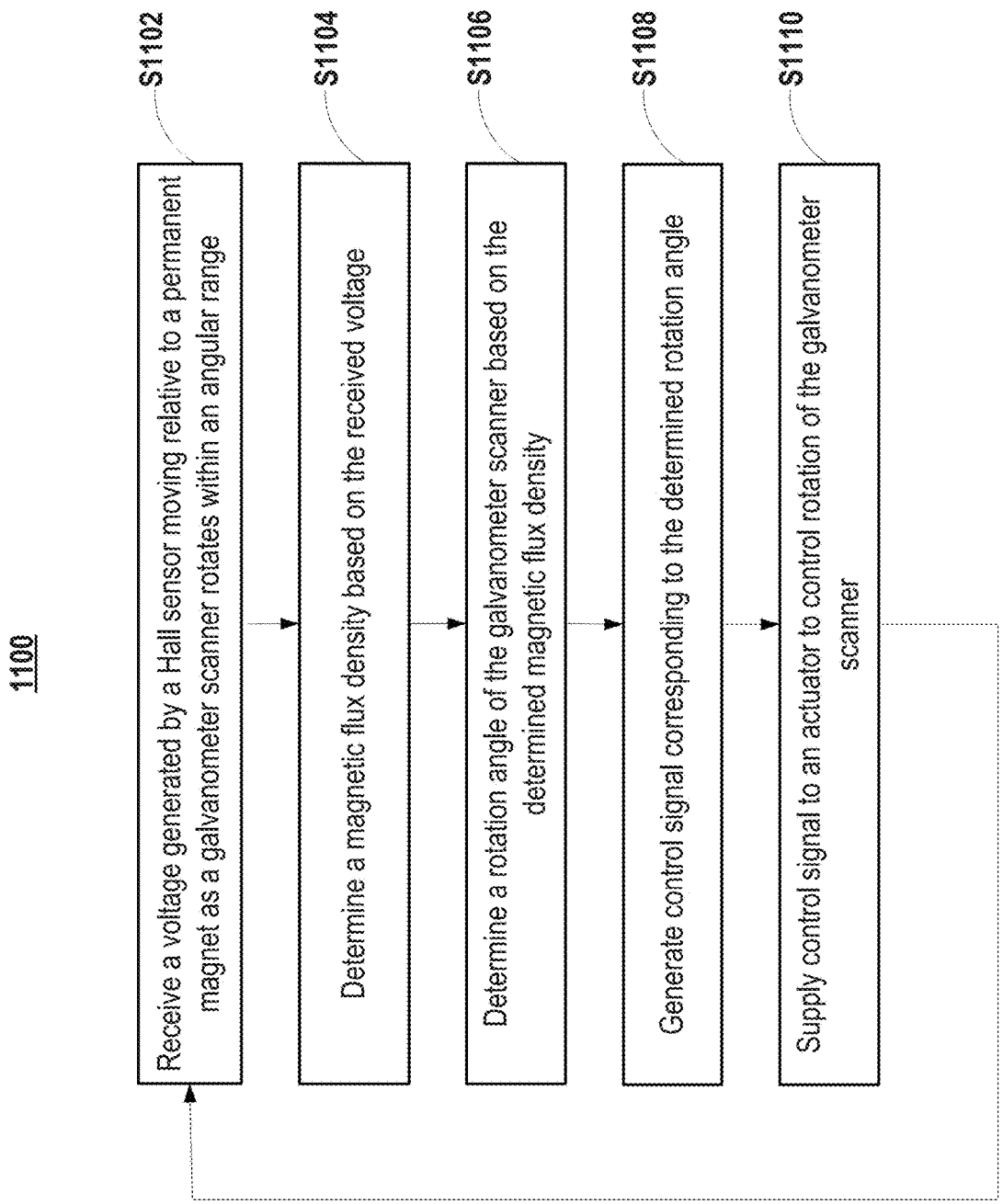
FIG. 11 illustrates a flow chart of an exemplary magnetic sensing method for a galvanometer scanner, according to embodiments of the disclosure.

FIG. 11 illustrates a flow chart of an exemplary magnetic sensing method 1100 for a galvanometer scanner, according to embodiments of the disclosure. For example, method 1100 may be implemented by magnetic sensing system 600 of FIG. 6 or magnetic sensing system 900 of FIG. 9 along with controller 206. However, method 1100 is not limited to that exemplary embodiment. Method 1100 may include steps S1102-S1110 as described below. It is to be appreciated that some of the steps may be optional to perform the disclosure provided herein. Further, some of the steps may be performed simultaneously, or in a different order than shown in FIG. 11.

In step S1102, a voltage signal (e.g., electrical signal 1110) is received by a processor (e.g., processor 1104) of a controller (e.g., controller 206) from a magnetic sensing system (e.g., magnetic sensing system 600 or 900) at a current time point. The voltage is generated by a Hall sensor (e.g., Hall sensor 604 or 904) that moves relative to a disc permanent magnet (e.g., magnet 602 or 902) when a galvanometer scanner rotates (e.g., galvanometer scanner 601 or 901). Consistent with some embodiments, one of the Hall sensor and the disc permanent magnet locates on the galvanometer scanner and the other locates off the galvanometer scanner. In some embodiments, the voltage signal may be sensed and sent to the controller when the galvanometer scanner rotates to a new angular position. For example, controller 206 may receive a voltage signal (e.g., electrical signal 1010) when the galvanometer scanner reaches a new rotation angle. In other words, the voltage signal is sensed upon actual knowledge that the rotation angle has changed. In some alternative embodiments, controller 206 may receive electrical signals periodically without knowing that the rotation angle of the galvanometer scanner has changed.

In step S1104, the received voltage signal (e.g., electrical signal 1010) may be used by the processor (e.g., processor 1004) of the controller (e.g., controller 206) to determine a magnetic flux density Bz through the Hall sensor at the sensed time point. Consistent with some embodiments, the intensity of the received voltage signal is proportional to the strength of the magnetic field (e.g., magnetic flux density Bz) through the Hall sensor. In some embodiments, the magnetic flux density may be determined based on the intensity of the received voltage signal using a pre-computed look-up table. For example, the look-up table may include a mapping between voltage values and magnetic flux densities.

In step S1106, the processor of the controller may determine the rotation angle of the galvanometer scanner based on the determined magnetic flux density at current time point. For example, processor 1004 of controller 206 can determine the rotation angle of galvanometer scanner 601 or 901 based on the determined magnetic flux density Bz using a look-up table. For example, processor 1004 may determine the rotation angle of galvanometer scanner 601 or 901 using the look-up table to map the determined magnetic flux density to one of the rotation angles of the galvanometer scanner.

In step S1108, the processor of the controller can generate a control signal based on the determined rotation angle of the galvanometer scanner. For example, processor 1004 of controller 206 may compare the determined rotation angle of the galvanometer scanner with a target angle at the current time point. If the determined rotation angle is smaller than the target angle at the current time point, processor 1004 may generate a control signal to speed up the rotation of the galvanometer scanner. If the determined rotation angle is larger than the target angle at current time point, processor 1004 may generate a control signal to slow down the rotation of the galvanometer scanner.

In step S1110, the processor of the controller can supply the generated control signal to actuator(s) of the galvanometer scanner to control rotation of the galvanometer scanner. For example, processor 1004 can change a rotation speed/rate of galvanometer scanner 601 or 901 by sending the control signal to control the actuator(s) of galvanometer scanner 601 or 901. The actuator(s) of the galvanometer scanner may adjust the rotation speed of the galvanometer scanner based on the received control signal from processor 1004 of controller 206. After supplying the generated control signal to the actuator(s) of the galvanometer scanner, the processor of the controller may determine the next rotation angle of the galvanometer scanner and provide feedback control the rotation of the galvanometer scanner for the next time point by repeating steps S1102-S1110.

Although the disclosure is made using a LiDAR system as an example, the disclosed embodiments may be adapted and implemented to other types of optical sensing systems that use magnetic sensing systems to sense angular positions of optical devices not limited to galvanometer scanners. For example, the embodiments may be readily adapted for optical scanning and/or imaging systems that use galvanometer scanners to scan objects.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A magnetic sensing system for a galvanometer scanner configured to rotate within a predetermined angular range, comprising:
   a disc permanent magnet configured to provide a magnetic field, the disc permanent magnet being fixed to a substrate of the galvanometer scanner, and a scanning mirror of the galvanometer scanner being formed on a surface of the substrate of the galvanometer scanner;
   a Hall sensor configured to generate a voltage proportional to a strength of the magnetic field as the Hall sensor and the disc permanent magnet move relatively to each other when the galvanometer scanner rotates, wherein the Hall sensor locates on and rotates with the galvanometer scanner and the disc permanent magnet locates off the galvanometer scanner; and at least one controller configured to determine a rotation angle of the galvanometer scanner based on a distance between the Hall sensor and the center of the disc permanent magnet, wherein the distance between the Hall sensor and the center of the disc permanent magnet is related to the generated voltage by the Hall Sensor.

2. The magnetic sensing system of claim 1, wherein the Hall sensor and the disc permanent magnet are placed such that the distance between the Hall sensor and the center of the disc permanent magnet changes within a predetermined range between a first predetermined distance and a second predetermined distance, as they move relatively to each other.

3. The magnetic sensing system of claim 2, wherein the strength of the magnetic field at the Hall sensor changes monotonically when the distance between the Hall sensor and the center of the disc permanent magnet changes monotonically between the first predetermined distance and the second predetermined distance.

4. The magnetic sensing system of claim 2, wherein the predetermined angular range of the galvanometer scanner is between a first rotation angle and a second rotation angle, wherein the first predetermined distance is the distance between the Hall sensor and the center of the disc permanent magnet when the galvanometer scanner rotates to the first rotation angle and the second predetermined distance is the distance between the Hall sensor and the center of the disc permanent magnet when the galvanometer scanner rotates to the second rotation angle.

5. The magnetic sensing system of claim 1, wherein the disc permanent magnet is fixed on a substrate off the galvanometer scanner and the Hall sensor is mounted on the galvanometer scanner, wherein the Hall sensor moves around a rotation axis of the galvanometer scanner along an arcuated trajectory when the galvanometer scanner rotates within the predetermined angular range around the rotation axis, wherein the center of the disc permanent magnet is not on the rotation axis of the galvanometer scanner.

6. The magnetic sensing system of claim 5, wherein a radius of the arcuated trajectory of the Hall sensor is selected such that the distance between the Hall sensor and the center of the disc permanent magnet changes monotonically as the galvanometer scanner rotates unidirectionally within the predetermined angular range.

7. The magnetic sensing system of claim 1, wherein the Hall sensor is parallel to a surface of the disc permanent magnet.

8. The magnetic sensing system of claim 1, wherein to determine a rotation angle of the galvanometer scanner based on the distance between the Hall sensor and the center of the disc permanent magnet, wherein the distance between the Hall sensor and the center of the disc permanent magnet is related to the generated voltage by the Hall sensor, the at least one controller is further configured to:

determine a value of a magnetic flux density at a time point based on the generated voltage at the time point; and determine the rotation angle of the galvanometer scanner at the time point based on the value of the magnetic flux density at the time point using a predetermined look-up table that maps the respective values of the magnetic flux density to rotation angles of the galvanometer scanner.

9. The magnetic sensing system of claim 1, wherein the at least one controller is further configured to adaptively control the rotation of the galvanometer scanner based on the determined rotation angle.

10. The magnetic sensing system of claim 9, wherein to adaptively control the rotation of the galvanometer scanner based on the determined rotation angle, the at least one controller is further configured to:

compare the determined rotation angle with a target rotation angle; and supply a control signal to an actuator of the galvanometer scanner to speed up or slow down the rotation of the galvanometer scanner based on the comparison.

11. A magnetic sensing method for a galvanometer scanner configured to rotate within a predetermined angular range, comprising:

moving a disc permanent magnet and a Hall sensor relative to each other as the galvanometer scanner rotates, wherein the Hall sensor locates on and rotates with the galvanometer scanner and the disc permanent magnet locates off the galvanometer scanner, wherein the disc permanent magnet is fixed to a substrate of the galvanometer scanner, and wherein a scanning mirror of the galvanometer scanner is formed on a surface of the substrate of the galvanometer scanner;

measuring a voltage generated by the Hall sensor caused by a relative movement of the disc permanent magnet and the Hall sensor; and determining, by at least one controller, a rotation angle of the galvanometer scanner based on a distance between the Hall sensor and the center of the disc permanent magnet, wherein the distance between the Hall sensor and the center of the disc permanent magnet is determined based on related to the voltage generated by the Hall sensor.

12. The magnetic sensing method of claim 11, wherein the Hall sensor and the disc permanent magnet are placed such that the distance between the Hall sensor and the center of the disc permanent magnet changes within a predetermined range between a first predetermined distance and a second predetermined distance, as they move relatively to each other.

13. The magnetic sensing method of claim 12, wherein a strength of a magnetic field at the Hall sensor changes monotonically when the distance between the Hall sensor and the center of the disc permanent magnet changes monotonically between the first predetermined distance and the second predetermined distance.

14. The magnetic sensing method of claim 12, wherein the predetermined angular range of the galvanometer scanner is between a first rotation angle and a second rotation angle, wherein the first predetermined distance is the distance between the Hall sensor and the center of the disc permanent magnet when the galvanometer scanner rotates to the first rotation angle and the second predetermined distance is the distance between the Hall sensor and the center of the disc permanent magnet when the galvanometer scanner rotates to the second rotation angle.

15. The magnetic sensing method of claim 11, wherein determining, by at least one controller, a rotation angle of the galvanometer scanner based on the distance between the Hall sensor and the center of the disc permanent magnet, wherein the distance between the Hall sensor and the center of the disc permanent magnet is related to the voltage generated by the Hall sensor further comprises:

determining a value of a magnetic flux density at a time point based on the generated voltage at the time point; and determine the rotation angle of the galvanometer scanner at the time point based on the value of the magnetic flux density at the time point using a predetermined look-up table that maps the respective values of the magnetic flux density to rotation angles of the galvanometer scanner.

16. The magnetic sensing method of claim 11, further comprising adaptively controlling the rotation of the galvanometer scanner, by the at least one controller, based on the determined rotation angle.

17. The magnetic sensing method of claim 16, wherein adaptively controlling the rotation of the galvanometer scanner, by the at least one controller, based on the determined rotation angle comprises:

comparing the determined rotation angle with a target rotation angle; and supplying a control signal to an actuator of the galvanometer scanner to speed up or slow down the rotation of the galvanometer scanner based on the comparison.

18. A galvanometer scanner assembly, comprising:
a substrate;
a mirror formed on a surface of the substrate;
a galvanometer scanner configured to rotate around a rotation axis within a predetermined angular range and coupled to the mirror;
a disc permanent magnet configured to provide a magnetic field, the disc permanent magnet fixed to a surface of the substrate; and
a Hall sensor configured to generate a voltage proportional to a strength of the magnetic field as the Hall sensor and the disc permanent magnet move relatively to each other when the galvanometer scanner rotates, wherein the Hall sensor locates on and rotates with the galvanometer scanner and the disc permanent magnet locates off the galvanometer scanner, wherein at least one controller is configured to determine a rotation angle of the galvanometer scanner based on a distance between the Hall sensor and the center of the disc permanent magnet, wherein the distance between the Hall sensor and the center of the disc permanent magnet is related to the generated voltage by the Hall Sensor.

19. The galvanometer scanner assembly of claim 18, wherein the Hall sensor and the disc permanent magnet are placed such that the distance between the Hall sensor and the center of the disc permanent magnet changes within a predetermined range between a first predetermined distance and a second predetermined distance, as they move relatively to each other, wherein the strength of the magnetic field at the Hall sensor changes monotonically when the distance between the Hall sensor and the center of the disc permanent magnet changes monotonically between the first predetermined distance and the second predetermined distance.

20. The galvanometer scanner assembly of claim 19, wherein the predetermined angular range of the galvanometer scanner is between a first rotation angle and a second rotation angle, wherein the first predetermined distance is the distance between the Hall sensor and the center of the disc permanent magnet when the galvanometer scanner rotates to the first rotation angle and the second predetermined distance is the distance between the Hall sensor and the center of the disc permanent magnet when the galvanometer scanner rotates to the second rotation angle.

* * * * *